United States Patent [19]

Maruyama et al.

[11] Patent Number: 5,548,716
[45] Date of Patent: Aug. 20, 1996

[54] RECORDING MEDIUM DUALIZING SYSTEM

[75] Inventors: Takumi Maruyama; Noriyuki Yokoshi, both of Kawasaki, Japan

[73] Assignee: Fujitsu Limited, Kanagawa, Japan

[21] Appl. No.: 283,780

[22] Filed: Aug. 1, 1994

[30] Foreign Application Priority Data

Dec. 17, 1993 [JP] Japan .................................. 5-318359

[51] Int. Cl.⁶ ............................................... G06F 11/00
[52] U.S. Cl. .................................... 395/183.12; 395/182.2
[58] Field of Search ............................ 395/180, 182.07, 395/182.17, 182.20, 183.02; 360/31; 365/201

[56] References Cited

U.S. PATENT DOCUMENTS

| | | | |
|---|---|---|---|
| 4,527,271 | 7/1985 | Hallee et al. | 371/20 |
| 4,931,922 | 6/1990 | Baty et al. | 364/200 |
| 5,134,712 | 7/1992 | Yamamoto | 395/800 |
| 5,363,503 | 11/1994 | Gleeson | 395/575 |

*Primary Examiner*—Robert W. Beausoliel, Jr.
*Assistant Examiner*—Norman M. Wright

[57] ABSTRACT

A main controller of a recording medium dualization system reads, when the power is turned on, three types of information: USE information (status information of a recording medium of each medium board) indicating whether or not the medium can be used; ACT information indicating which of the recording mediums is or was used in an active system; and PWON information indicating whether or not the power for the recording medium is turned on, whereupon the main controller sets the information to denote that the master system is an active system and executes a mirroring process whereby the USE information and the PWON information of the slave system are identical to the master system. When it is found that the recording medium of the master system is removed, on the basis of the USE and ACT information, the slave system is switched to an active system, and the corresponding information setting is performed. When it is found that the recording medium of the master system is mounted, on the basis of the PWON information, the USE information and the PWON information of the slave system are mirrored onto the master system.

9 Claims, 19 Drawing Sheets

FIG.1

| INFORMATION | BIT NAME | MEANING OF OFF="0" | MEANING OF ON="1" |
|---|---|---|---|
| FIRST INFORMATION | USE | THE RECORDING MEDIUM CAN NOT BE USED | THE RECORDING MEDIUM CAN BE USED |
| SECOND INFORMATION | ACT | THE RECORDING MEDIUM IS DESIGNATED AS A SLAVE | THE RECORDING MEDIUM IS DESIGNATED AS A MASTER |
| THIRD INFORMATION | PWON | POWER FOR THE RECORDING MEDIUM IS NOT ON | POWER FOR THE RECORDING MEDIUM IS ON |

FIG.11
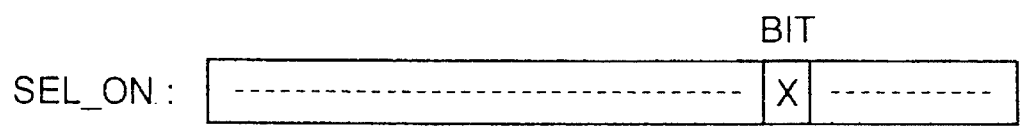
SEL_ON:
{ X=0 INDICATES SYSTEM 0 OR LOCAL SYSTEM
  X=1 INDICATES SYSTEM 1 OR REMOTE SYSTEM }
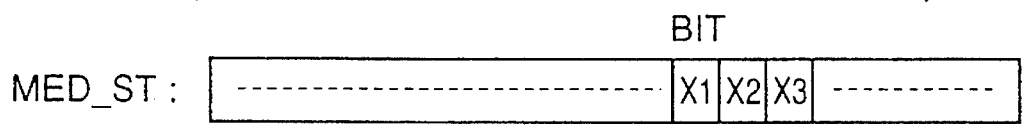
MED_ST:
{ X1 INDICATES REVERSAL OF PWON; 0 INDICATES INVALID INFORMATION; 1 INDICATES VALID INFORMATION.
X2 STORES ACT; X3 INDICATES USE. }

FIG.13

| BIT | FUNCTION |
|---|---|
| SELECTION VALIDITY | IF THIS SIGNAL IS ON ("1"), IT INDICATES THAT MEDIUM IN ACTIVE SYSTEM IS SELECTED. SELECTION VALIDITY BIT CAN BE USED TO DENOTE STATUS AND TO EFFECT CONTROL FOR OPERATING/STOPPING APPARATUS OR SYSTEM |
| 0/1 SELECTION | 0/1 SELECTION BIT INDICATES WHICH SYSTEM, 0=0 SYSTEM (LOCAL SYSTEM) OR 1=1 SYSTEM (REMOTE SYSTEM) IS SELECTED. 0/1 SELECTION BIT CAN BE USED TO CONTROL ACTIVE MEDIUM |

RECORDING MEDIUM DUALIZING SYSTEM

BACKGROUND OF THE INVENTION

1. Field of the Invention

The present invention relates to a recording medium dualizing system, and more particularly to a system for dualizing external recording medium such as a hard disk or a magneto-optical disk.

In today's information systems and apparatuses, service information and operation program have a large volume. As a result of this, providing an external recording medium and extracting information therefrom is a generally employed scheme.

Hard disks and magneto-optical disk are known as such an external auxiliary recording medium. For improved system reliability, a system operation in which the recording medium is dualized in actual operations is often employed.

2. Description of the Related Art

When determining which recording medium is to be made active in a dual recording medium system, a strict control for preventing an erroneous operation is required.

Two methods of determining an active recording medium are: 1) Maintenance personnel takes the responsibility of determining an active medium; 2) The information relating to an active system is retained internally so that the system determines an active medium in an autonomous manner.

As a means for embodying the method 1) described above, a switch for linking the system operation and the job of the maintenance personnel may be provided so as to allow the maintenance personnel to select a recording medium for the active system. However, this has drawback in that a human error leads to a change in the operating state. For example, an error may lead to an operation governed by an unwanted operation program or to a stop of the operation (recording medium malfunction).

In one approach which embodies the method 2) described above, information relating to the active system is written to a recording medium in a predetermined format, and a recording medium for the active system is determined in an autonomous manner by reading such information. This approach, however, has drawbacks in that a wait time (procedure) for reading the information stored in the recording medium is required, and there is a likelihood that the system will stop in case the active system information cannot be read due to a malfunction of the recording medium. Another problem is that, when the information relating to the active system or the information relating to the non-active system is updated, reading and writing of service information is prevented, thus leading to a reduced processing ability.

Moreover, in the method 2), when the system is stopped and restarted after an external recording medium is exchanged, or when the system is restarted following a failure in the power supply, the information stored in the main memory is not updated accordingly, or no information is stored in the main memory. Therefore, maintenance personnel have to somehow determine the external recording medium that was designated as an active recording medium.

SUMMARY OF THE INVENTION

Accordingly, an object of the present invention is to provide a recording medium dualizing system in which a selection of an active recording medium upon a restart of the system, and not upon an initial start-up, can be performed smoothly and reliably.

Another and more specific object of the present invention is to provide a recording medium dualization system comprising: medium boards each having a recording medium and a communication controller, one medium board belonging to a master system and the other medium board belonging to a slave system; a main controller having a communication controller connected to the communication controllers of the medium boards; and a medium controller for transferring operation information between the recording mediums and the main controller, wherein power is supplied to the medium boards, the main controller and the medium controller by one common system power unit, and the communication controller of the main controller reads, when the power is turned on, first information (status information of the recording medium) indicating whether or not the recording medium can be used, from the communication controllers of the medium boards, reads second information indicating which of the recording mediums is or was used in an active system, and reads third information indicating whether or not the power for the recording medium is turned on, whereupon the main controller designates the master system as the active system, sets the first through third information in the active system, and executes a mirroring process whereby the first through third information of the slave system is made to be identical to corresponding information in the master system, so that, when it is detected, on the basis of the first and second information, that the recording medium of the master system is removed, the slave system can be switched to become the active system, and the first through third information are set in the active system, and so that, when it is detected, on the basis of the third information, that the recording medium of the master system is mounted, the first through third information of the slave system are mirrored to the master system.

According to the recording medium dualizing system of the present invention, even when the information of the active system and that of the reserve system are not identical to each other in a dualized system, the selection of the recording medium which has a content identical to that of the previously active recording medium is achieved, because the system, to which the operation is switched to upon a restart, is able to read the information held in the previously active system. Hence, the present invention has an advantage in that an inter-system information update procedure is not necessary.

BRIEF DESCRIPTION OF THE DRAWINGS

Other objects and further features of the present invention will be apparent from the following detailed description when read in conjunction with the accompanying drawings, in which:

FIG. 1 is a table explaining first through third information used in the recording medium dualization system of the present invention;

FIG. 11 is a memory management information format in the main controller used in the recording medium dualization system of the present invention;

FIG. 13 is a table showing the assignment of control bits obtained in the hardware shown in FIG. 12;

DESCRIPTION OF THE PREFERRED EMBODIMENTS

Figure 2:
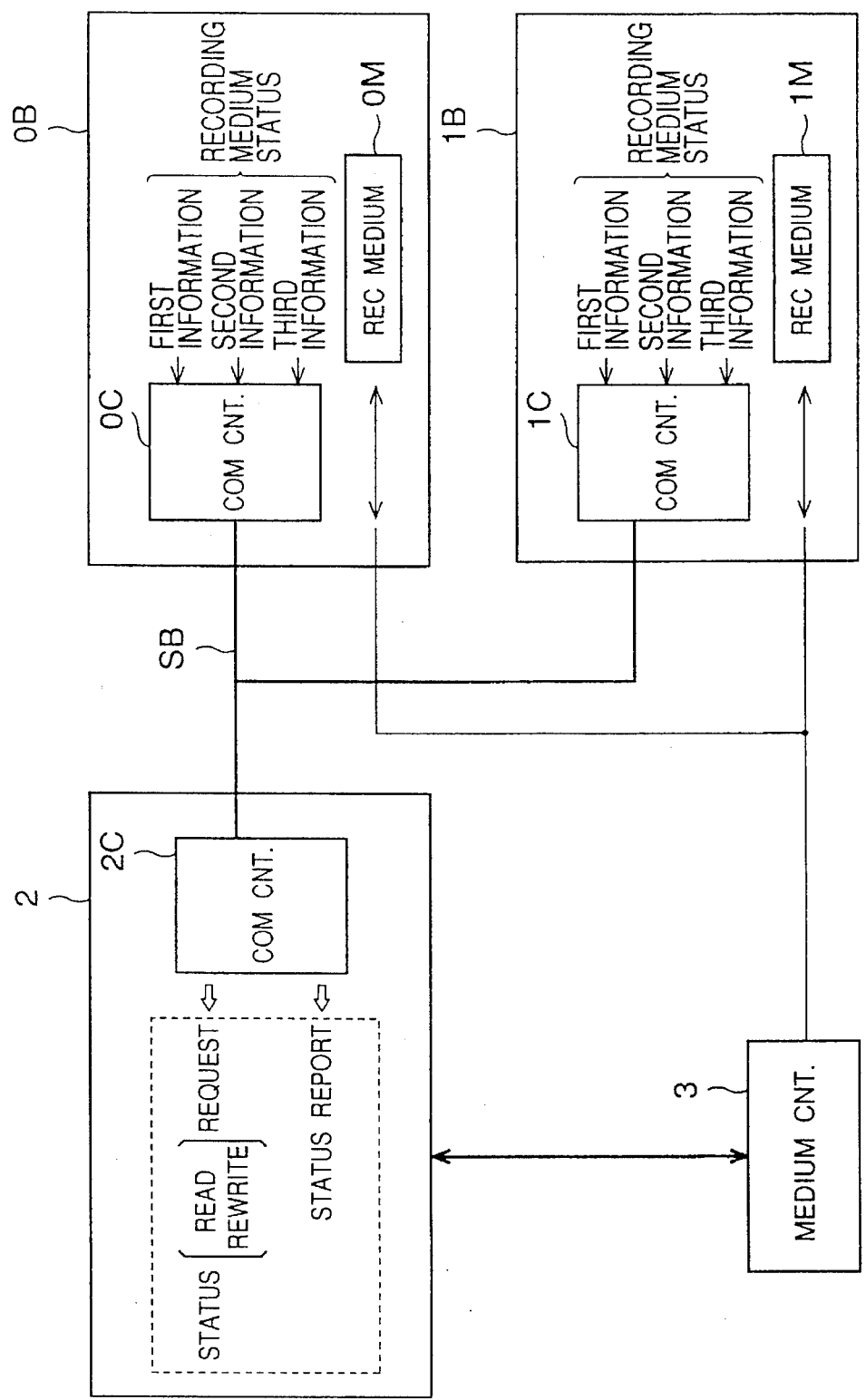
FIG. 2 is a diagram explaining the principle of a first embodiment of the present invention.

An explanation will first be given, with reference to FIG. 1, of three kinds of information, i.e., first information USE, second information ACT, and third information PWON.

1) USE is an information bit indicating whether or not a recording medium 0M or a recording medium 1M can be used. By default (at an initial state), USE is "0" (can not be used). The recording medium associated with USE having a value of "0" can be used as a bootable medium by performing a process such as a format or an install at any time while the system operation program is run. By setting USE to a value of "1" (=ON), the medium can be a rebooting medium. When it is determined that there is a failure, USE is set to "1" (=ON) so that an unnecessary access to the medium can be prevented as this information is referred to when the system is restarted.

2) ACT is an information bit indicating which of the recording mediums 0M and 1M is or was designated as part of the active system.

Even when the recording medium is dualized, there is bound to be a period of time, short or long, in which two sets of information stored in the active medium and the non-active medium do not agree with each other. While it is true that the chance of an occurrence of disagreement is reduced by duplicating information at short cycles during the operation, such a control may cause a degradation in the processing capability. Hence, the dualization control is performed in a relatively long cycle.

At any given moment, the medium in which the information has been updated can be identified. ACT is a control bit indicating the identity of such a medium. Since the medium having ACT set to "1" is the medium containing the latest information, the operation based on the latest management information can be performed by referring to this information bit ACT when the system is restarted.

3) PWON is an information bit indicating whether power for the recording medium 0M or the recording medium 1M is ON. PWON becomes ON when the information processing apparatus or the system is turned ON, or when a medium is mounted in the apparatus or the system. Since USE and ACT are invalid in this state, PWON can serve as information which allows a determination of an active recording medium.

By establishing a default operation corresponding to the ON state of PWON, maintenance personnel do not need to perform an unnecessary selection of a recording medium. By setting PWON to OFF while the operation program is being run, and by setting the above described USE and ACT as well, it is possible to determine a proper medium required in the operation upon a restart of the system.

A description will now be given, with reference to FIGS. 2 and 3, of a first embodiment of the present invention.

The recording medium dualization system according to the first embodiment comprises: medium boards each having a recording medium and a communication controller, one medium board belonging to a master system and the other medium board belonging to a slave system; a main controller having a communication controller connected to the communication controllers of the medium boards; and a medium controller for transferring operation information between the recording mediums and the main controller, wherein power is supplied to the medium boards, the main controller and the medium controller by one common system power unit, and the communication controller of the main controller reads, when the power is turned on, first information (status information of the recording medium) indicating whether or not the recording medium can be used, from the communication controllers of the medium boards, reads second information indicating which of the recording mediums is or was used in an active system, and reads third information indicating whether or not the power for the recording medium is turned on, whereupon the main controller designates the master system as the active system, sets the first through third information in the active system, and executes a mirroring process whereby the first through third information of the slave system is made to be identical to corresponding information in the master system, so that, when it is detected, on the basis of the first and second information, that the recording medium of the master system is removed, the slave system can be switched to become the active system, and the first through third information are set in the active system, and so that, when it is detected, on the basis of the third information, that the recording medium of the master system is mounted, the first through third information of the slave system are mirrored to the master system.

In this embodiment, it is assumed that there is one power supply system for supplying power to the system. Referring to FIG. 2, when the power is turned on, a main controller 2 reads, via communication controllers 0C and 1C, the status of the recording mediums 0M and 1M located in respective medium boards 0B and 1B, one medium board belonging to an active system (master system) and the other medium board belonging to a reserve system (slave system) at a given time. The recording medium 0M and the medium board 0B form a "system 0" and the recording medium 1M and the medium board 1B form a "system 1". It is assumed that the recording medium 0M of the medium board 0B, which medium is designated by default (i.e., in the initial state) as belonging to a master system, is selected. A PWON clear is performed, and ACT and USE are set to an ON state.

An operation of the first embodiment will be described with reference to FIG. 3. Referring to FIG. 3, at an arbitrary timing during the operation, a PWON clear (building into the system) of a slave system is performed, and a matching process (setting of USE) for matching the information in the slave system and the master information is performed through a mirroring process.

A medium controller 3, which is disposed between the recording mediums 0M, 1M and the main controller 2, extracts the information stored in the recording mediums, such as an executable program or an operation information, so as to execute an operation.

Thereafter, collection of the latest information may be required during the operation. In this case, the system is temporarily stopped, and the recording medium 0M of the system 0 (master system) is removed. Since, as described above, USE is set in the medium board 1B through a mirroring process, the system 1 can be employed as a master system upon the restart of the system, by reading the status of recording medium 1M.

When the recording medium 0M is mounted in the system 0 medium board 0B again, the latest information exists in the system 1. In order to ensure that the two sets of information match, a build in/mirroring process is performed.

Figure 4:
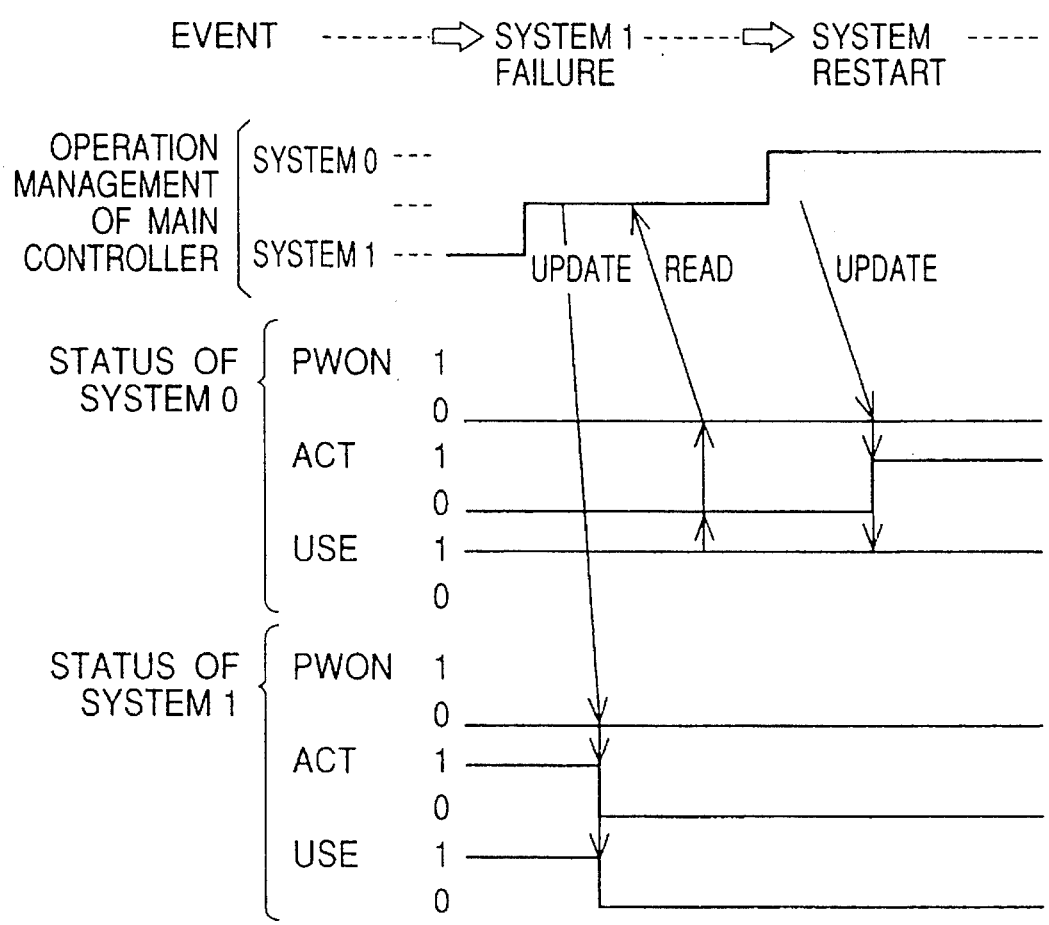
FIG. 4 is a second time chart explaining the operation of the first embodiment.

A different operation case is considered with reference to FIG. 4. Referring to FIG. 4, when a failure occurs in the slave system medium board 1B during the operation, normal access to the malfunctioning medium can not be guaranteed. Accordingly, the system 1 is made unusable by modifying the status thereof (ACT and USE are cleared). The maintenance personnel may then be informed of the failure. The status of the system 0 is then read and checked. When it is found that the medium that had been used in a slave system can be used, it is immediately put into operation in a master system.

Another operation case will be described with reference to FIG. 5, in which it is assumed that a failure has occurred in the medium in the master system, as in the case of FIG. 4. The system 1 is made unusable by modifying the status thereof (ACT and USE are cleared). However, it is assumed that the mirroring process of the system 0 has not been carried out or it has not been completed, and that a recording medium that can be operated does not exist in the system 0. Therefore, it is not guaranteed that the content of the operation program and the service information is up-to-date. Accordingly, the maintenance personnel are notified of the failure, and the system may be stopped so as to prevent an erroneous operation.

Referring to FIG. 2 again, it will be noted that the first embodiment is configured such that a communication controller 2C is provided in the main controller 2. Communication between the communication controller 2C and the communication controllers 0C, 1C of the respective medium boards 0B, 1B is executed via a serial bus SB.

A description will now be given, with reference to FIG. 6, of a second embodiment.

The recording medium dualization system according to the second embodiment is configured such that the main controller has two communication controllers which are connected to the respective communication controllers of the medium boards via respective parallel buses.

The operation of the second embodiment is the same as the operation described with reference to FIGS. 3–5. Referring to FIG. 6, the difference between the first embodiment and the second embodiment is that two communication controllers 2C1 and 2C2 are provided in the main controller 2 instead of only one as in the first embodiment. Reading and writing of control information is executed via parallel buses PB1 and PB2 respectively connected to the communication controllers 0C and 1C of the medium boards 0B and 1B.

While this arrangement will increase the number of pins to be arranged in the medium boards, a fast access is achieved, and a time required for determination can be reduced.

Figure 6:
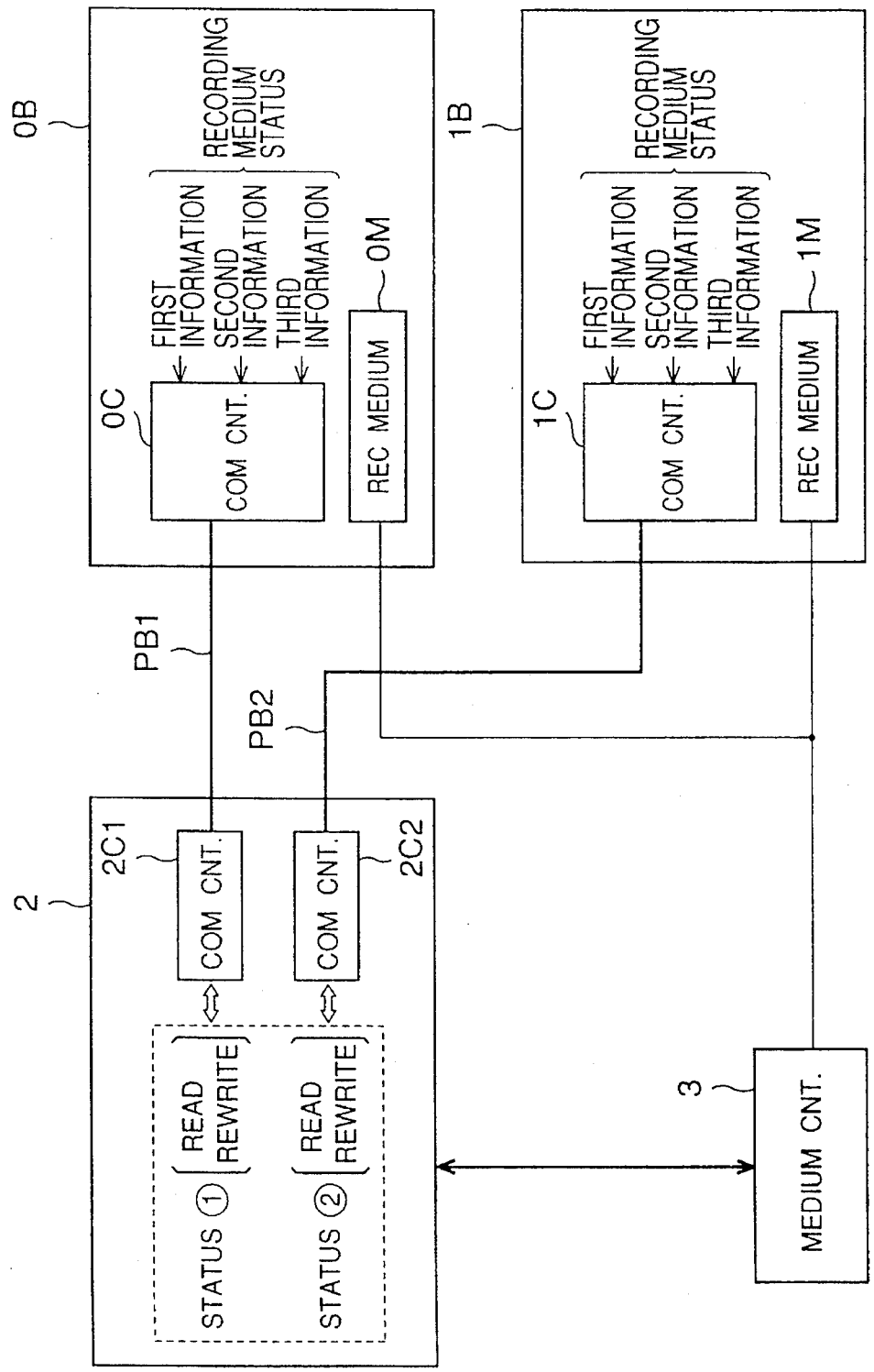
FIG. 6 is a diagram explaining the principle of a second embodiment.
Figure 7:
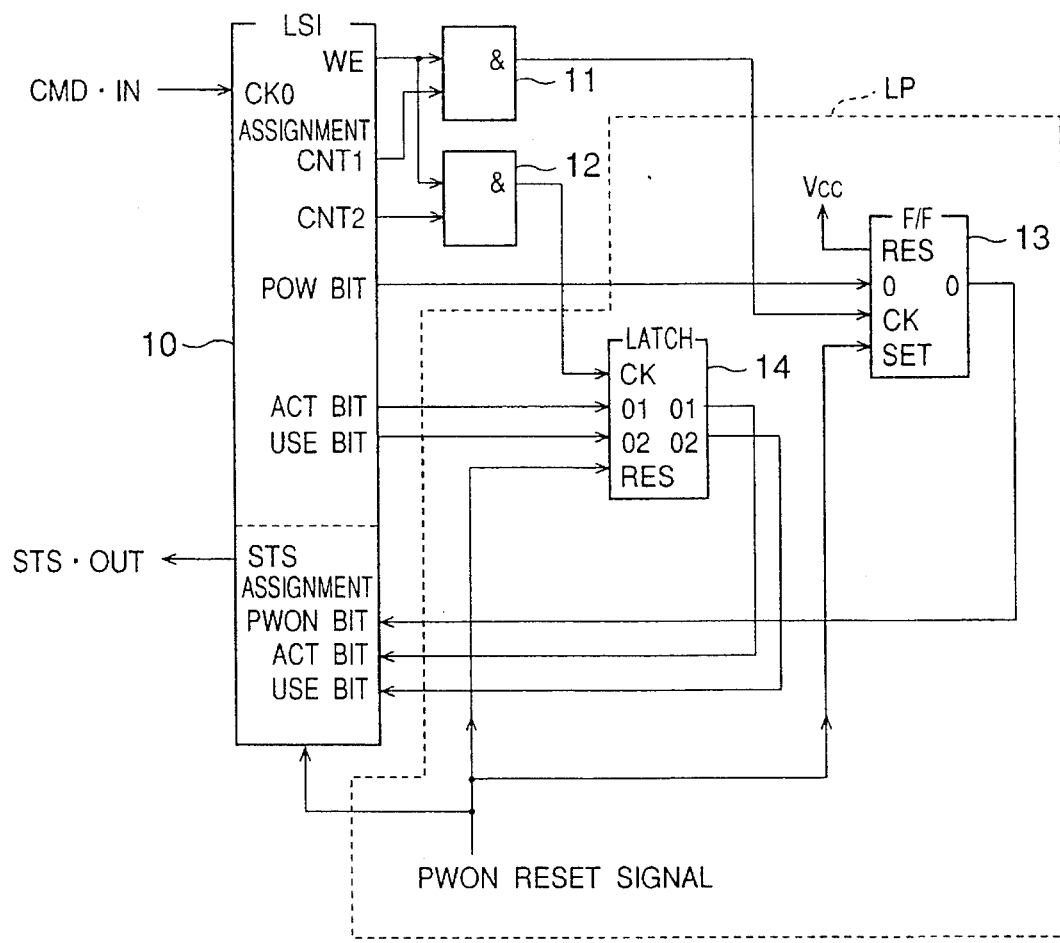
FIG. 7 is circuit diagram of a communication controller used in the recording medium dualization system according to the first embodiment.
Figure 8:
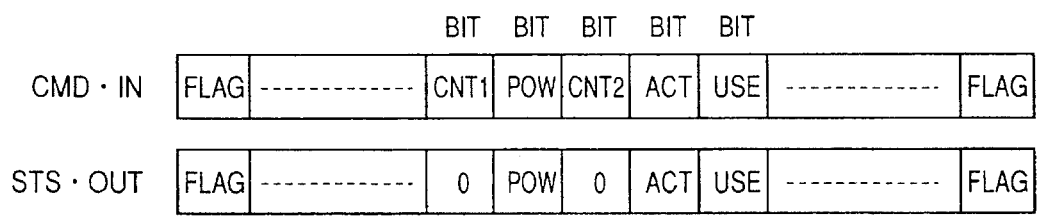
FIG. 8 is a diagram showing a control frame used in the communication controller shown in FIG. 7.

FIG. 7 shows a construction of the logical circuit forming the communication controllers 0C and 1C of the respective medium boards 0B and 1B shown in FIGS. 2 and 6. Reading and writing of information is executed by an LSI controlling a serial communication as shown in FIG. 8. In this way, the number of pins to be arranged in the medium boards can be comparatively small.

This logical circuit includes an LSI 10 which receives a frame CMD.IN for requesting a read or a rewrite from the main controller 2, and returns a frame STS.OUT for reporting the status to the main controller 2; an AND gate 11 which ANDs a write enable signal WE of the LSI 10 and a control signal CNT 1 of the LST 10; an AND gate 12 which ANDs a write enable signal WE and a control signal CNT 2; a flip-flop 13 which receives a PWON bit (third information) at the data input, receives an output signal of the AND gate 11 at the clock input, and outputs a status PWON bit from a Q output terminal to the LSI 10; and a latch circuit 14 which receives a USE bit (first information) at the data input D1, receives an ACT bit (second information) at the data input D2, receives an output signal from the AND gate 12 at the clock input, and outputs the status USE bit and ACT bit from Q1 and Q2 output terminals, respectively, to the LSI 10.

The flip-flop 13 and the latch circuit 14 are reset by means of a power on reset signal PWON when the power is turned on.

A description will now be given, with reference to the time chart of FIG. 9, of the operation of the communication controller of FIG. 7.

First, the LSI 10 receives the frame CMD.IN as serial data, and performs an S/P conversion. In response to the input data, the LSI 10 outputs the corresponding write enable signal WE, and also outputs "1's" in correspondence to the ON states of the CNT 1 bit and the CNT 2 bit.

When the power is turned on, the power on reset signal PWON is supplied to the flip-flop 13 and the latch circuit 14 so that the initial state, in which the flip-flop 13 is turned ON and the latch circuit is turned OFF, is induced.

Figure 9:
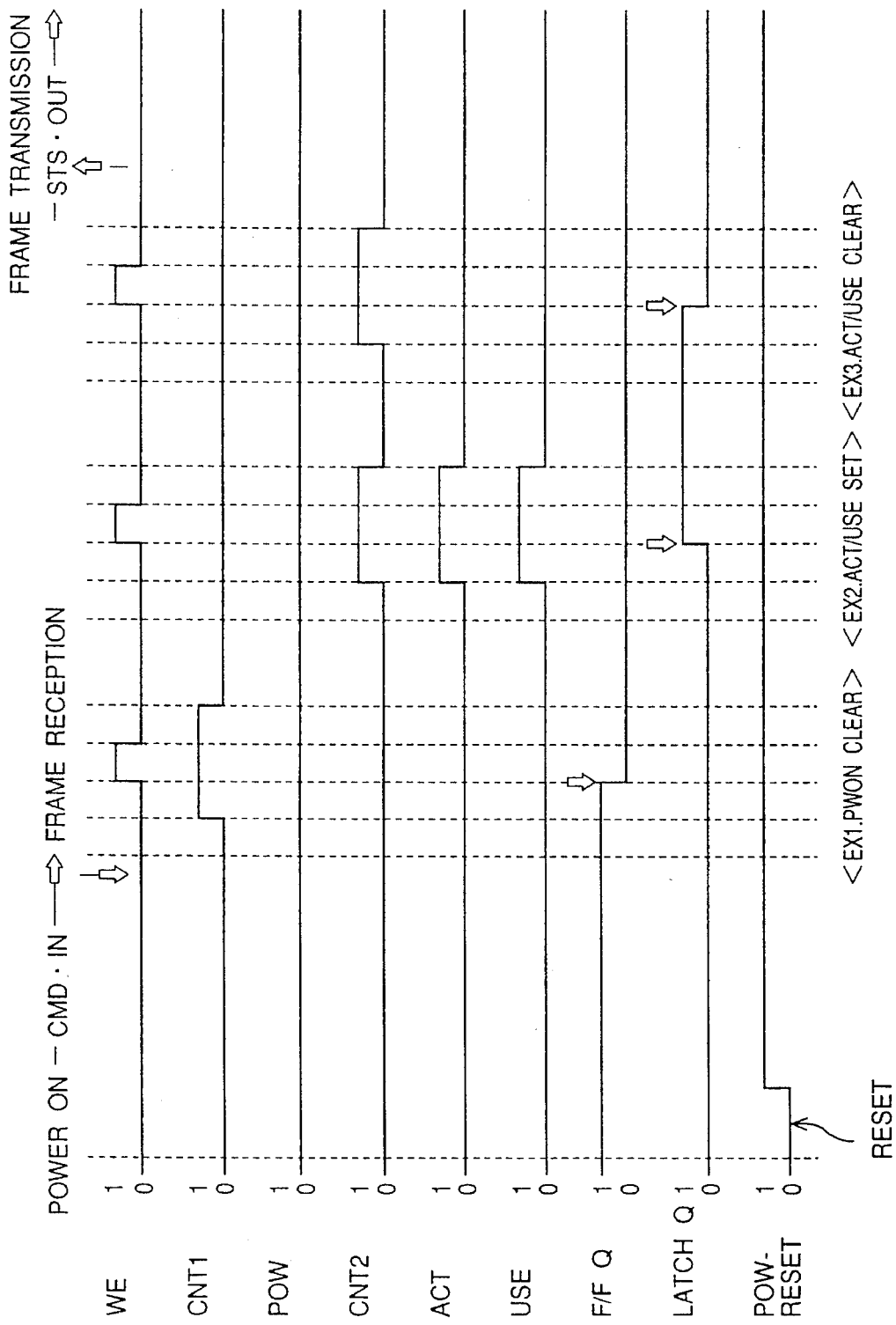
FIG. 9 is a time chart of the operation of the communication controller shown in FIG. 7.

Three examples of signal combinations are shown in FIG. 9. In Ex. 1, the frame CMD.IN having the CNT 1 bit ON and the PWON bit ON is received, and, accordingly, the output Q of the flip-flop 13 is cleared by the AND gate 11 to become 0. In Ex. 2, the frame CMD.IN having the CNT2 bit ON, the ACT bit ON and the USE bit ON is received so that the outputs Q1 and Q2 of the latch circuit 14 are set to be "1" by the AND gate 12. In Ex. 3, the frame CMD.IN having the CNT 2 ON and having the ACT and USE bits OFF is received: in other words, the frame CMD.IN for clearing the status is received. Accordingly, the outputs Q1 and Q2 of the latch circuit 14 are reset to 0.

The Q outputs of the flip-flop circuit 13 and the latch circuit 14 are supplied to the LSI 10 as the PWON bit, the ACT bit and the USE bit, the LSI 10 performs a P/S conversion so that the frame STS.OUT, in which the Q outputs are assigned to respective positions in serial data, is output. In this way, the status report is provided to the main controller 2.

When the main controller 2 applies an S/P conversion to the frame STS.OUT, the status of the medium boards 0B and 1B can be read. In this way, the status reading and updating can be achieved by means of the LIS communication.

Figure 3:
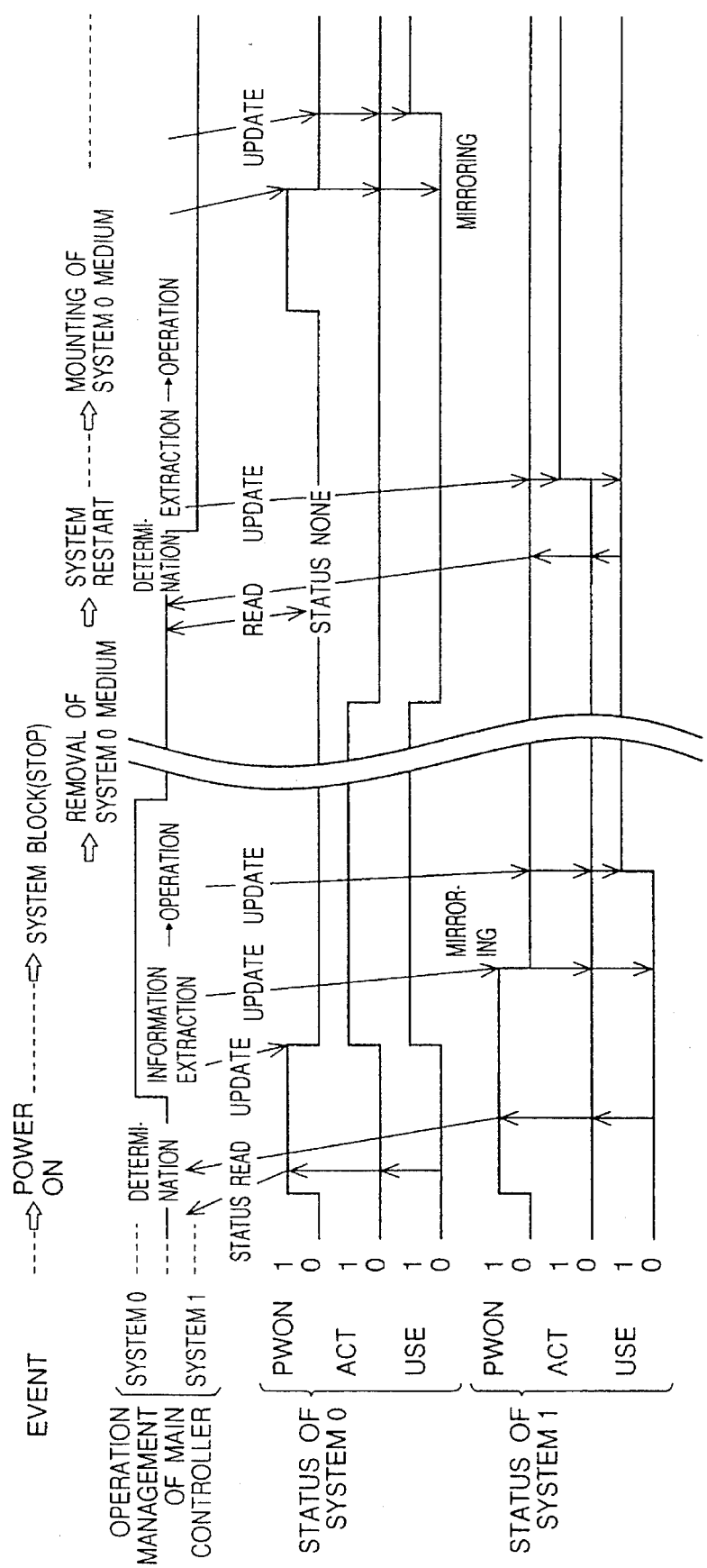
FIG. 3 is a first time chart explaining the operation of the first embodiment.
Figure 10:
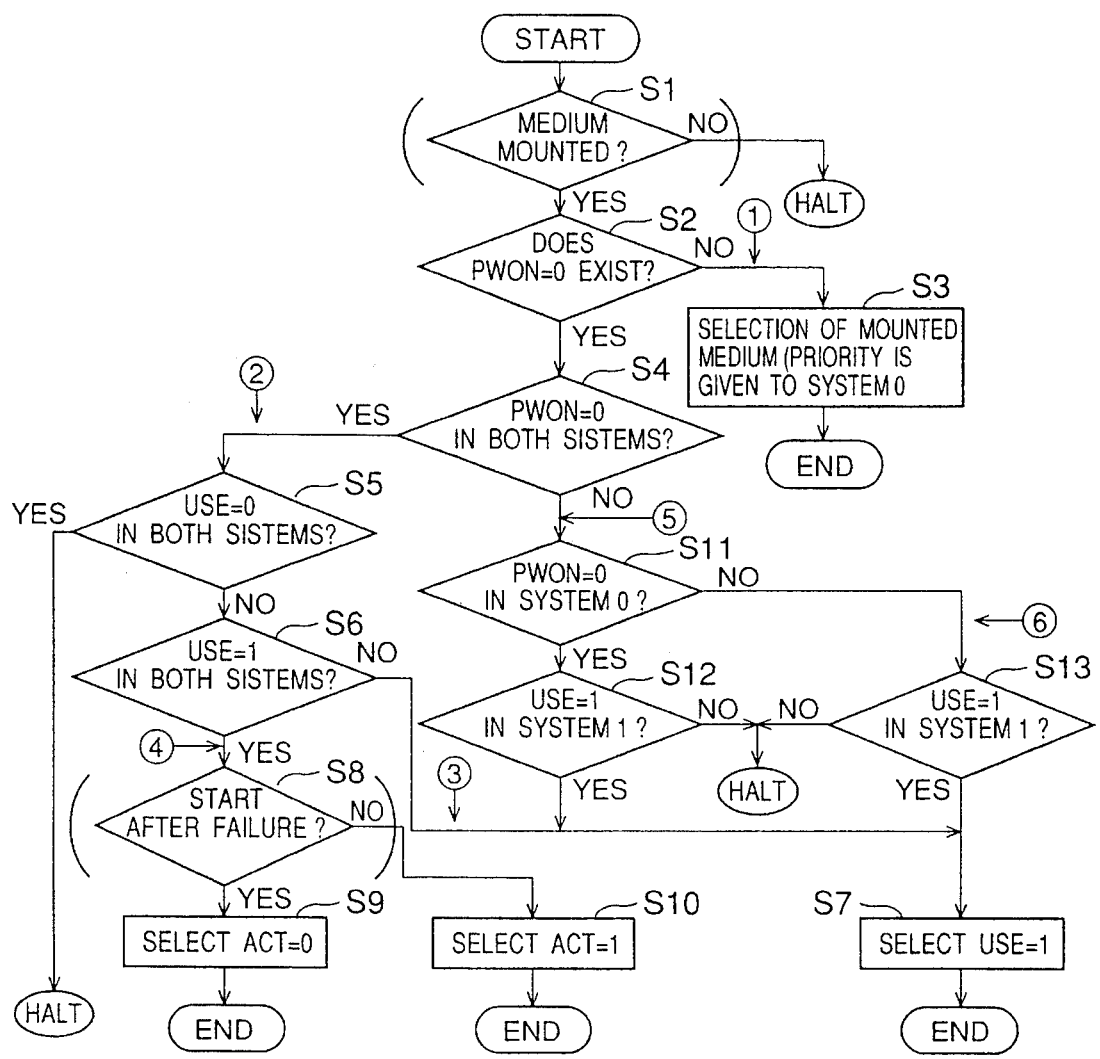
FIG. 10 is a flowchart showing the operation of software for determining a master system recording medium in a main controller used in the recording medium dualization system of the present invention.

FIG. 10 is a flowchart of a "determination" process executed when the main controller 2 performs the master management shown in FIG. 3. FIG. 11 shows a management format on a main memory (not shown) in the main controller 2. Steps that are enclosed by parentheses in FIG. 10 are those steps performed by hardware means.

The recording medium is mounted when the power is turned on. As indicated by the circuit diagram of FIG. 7, PWON=1, ACT=0 and USE=0. The status reported in a communication is stored in the memory as bits X1–X3 using a memory management format MED_ST shown in FIG. 11. When it is determined in a step S2 that no PWON=0 settings are found, that is, the power is turned on in both systems, the process proceeds to a point ① in FIG. 10, that is, the system 0 is automatically selected.

As the step S2 is carried out, "0" is set in a bit X of a format SEL_ON shown in FIG. 11. A priority is given to the recording medium mounted in the system 0 (local system) so that it is selected (step S3). When there is only one power supply system in the entire system, the PWON=1 settings always exist, resulting in the process automatically proceeding to a step S3.

Then, as shown in FIG. 3, the medium controller 3 shown in FIG. 2 extracts and updates operation information while the operation program is being run so that a dualization of the recording medium (mirroring) is carried out. Then, the process proceeds to a point ② via the steps S2 and S4. Thereafter, when there is a system restart request (or when there is a restart request occurring as a result of the power being turned on again in a system having a plurality of power supply systems), the process proceeds to a step S8 if both systems are normal. If there is no master system, only the USE bit in the slave system is set to "1" (indicating the recording medium can be used), and then the process proceeds, via the steps 5 and 6, to a point ③, where the slave system (system 1) in which USE=1 is set is selected (step S7).

When there occurs a failure due to a defective recording medium or a program error, the SEL_ON can be referred to so that the other system can be selected. In this case, the process proceeds to a point ④, in which a supposition is made that there is an error in the master system, and the slave system (ACT=0) is selected (steps S8, S9), thereby preventing the system from being booted from the defective medium. When the system is not started following a failure, it is assumed that there was no error in the master system, whereupon the master system (ACT=1) is selected (step S10).

When the system 0 (default) can not be found after the power is turned on again, the system 1 is used in a restart.

The process proceeds to a step S3 as described above so that the recording medium 1M of the system 1 is selected. Even when the recording medium of the system 0 is mounted thereafter, the process is bound to proceed to points ⑤ and ⑥ via steps S4 and S11, respectively, when there is a request for a restart. In this way, the master system recording medium in which the latest information is stored can be selected (step S7).

When the recording medium of the system 1 is mounted in the middle of the operation of the system 0, USE=1 of the system 0 remains valid, and the operation of the system 0 is continued.

Figure 12:
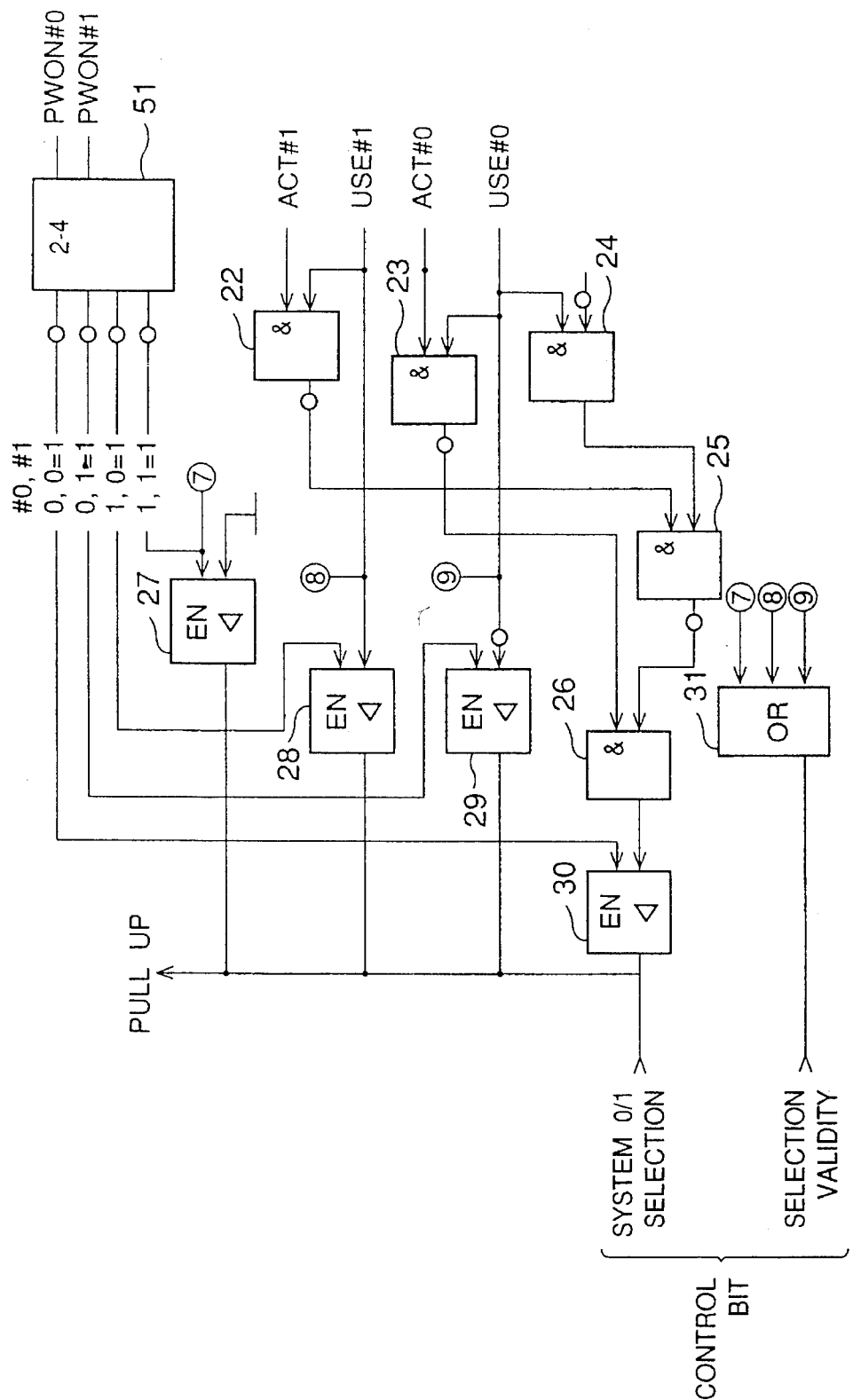
FIG. 12 is a logic circuit diagram of hardware for determining a master recording medium in the main controller used in the recording medium dualization system of the present invention.

FIG. 12 shows a logical circuit which is an embodiment of the flow for selecting a master in an active system. Referring to FIG. 12, the logical circuit includes a decoder 21 for converting PWON bits (two bits) of both systems into four bits; a NAND gate 22 for NANDing the ACT bit of the system 1 and the USE bit of the system 1; a NAND gate 23 for NANDing the ACT bit of the system 0 and the USE bit of the system 0; an AND gate for ANDing the USE bit of the system 0 and a value obtained by reversing the ACT bit of the system 0; a NAND gate 25 for NANDing the output signals of the NAND gate 22 and the AND gate 24; and an AND gate 26 for ANDing the output signals of the NAND gate 23 and the NAND gate 25.

The circuit also includes a gate circuit 27 for returning a pullup output to a ground level when the output of the decoder 21 becomes (1, 1) so that a priority selection of the system 0 is made; a gate circuit 28 which uses the USE bit of the system 1 as a system 0/1 selection output, when the output of the decoder 21 becomes (1, 0); a gate circuit 29 which uses the USE bit of the system 0 as a system 0/1 selection output, when the output of the decoder 21 becomes (0, 1); a gate circuit 31 which uses the output signal of the AND gate 26 as a system 0/1 selection output, when the output of the decoder 21 becomes (0, 0); and an OR gate which receives the signals occurring at points ⑦–⑨ as inputs, and outputs a signal for determining whether or not the recording medium is a medium which can be selected for use in an active system.

In this logical circuit, the output signal of the gate circuit 27 corresponds to the step S3 of FIG. 10, the output signal of the gate circuit 28 corresponds to the step S7 subsequent to the points ⑤ and ⑥, the output signal of the gate circuit 29 corresponds to the step S7 subsequent to the steps S11 and S12 of FIG. 10, and the output signal of the gate circuit 30 corresponds to the step of passing the point ② of FIG. 10.

It is to be noted that there are cases in which the system 0/1 selection output of this logical circuit is invalid. Only when the selection output is found to be valid by allowing the signals occurring at the points ⑦–⑨ to be supplied to the OR gate 31, is the selection output employed.

FIG. 13 is a table explaining the assignment of control bits obtained in the hardware shown in FIG. 12.

Figure 14:
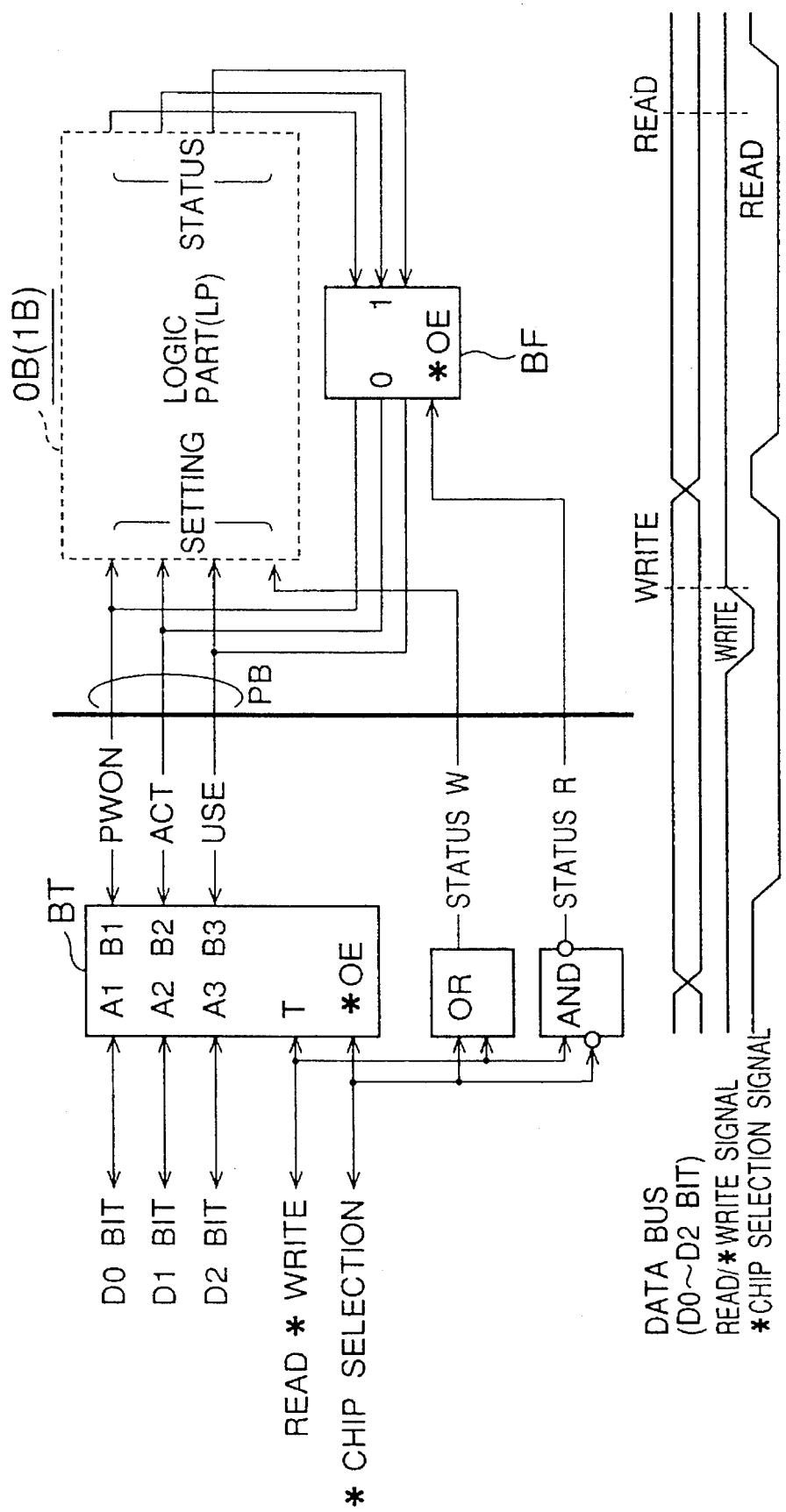
FIG. 14 is a diagram showing the construction of the recording medium dualization system according to the second embodiment.

FIG. 14 shows the construction of the recording medium dualization system according to the second embodiment shown in FIG. 6.

In this circuit, the LSI 10 shown in FIG. 7 is not employed. A logic part LP surrounded by a broken line is connected to a bidirectional bus transceiver BT provided in the main controller 2 opposite the logic part LP via the parallel bus PB.

The transfer direction of the bus transceiver BT is determined by a read/write signal T and a chip selection signal *OE provided by the main controller 2. The writing to the logic part LP is executed when a status write signal W is supplied from the main controller 2. For control of the reading from the logic part LP, a read signal R is supplied from the main controller 2 to a terminal *OE of a buffer BF.

Figure 5:
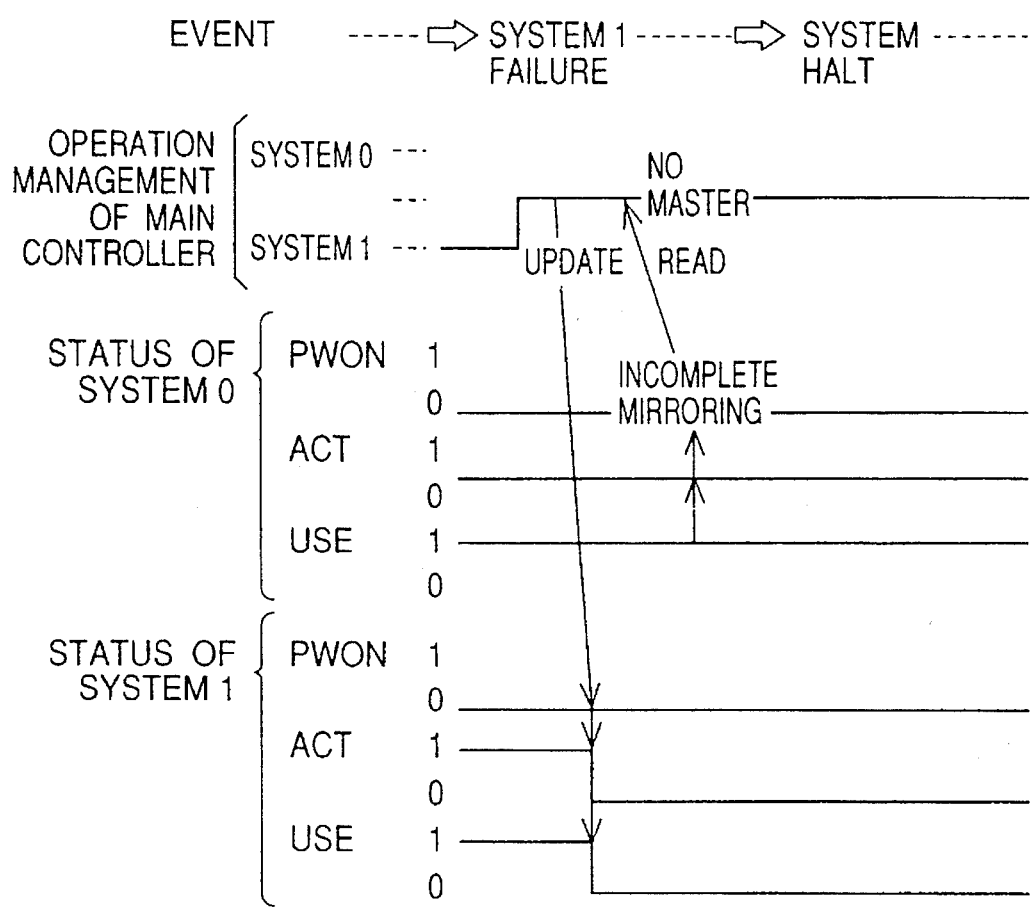
FIG. 5 is a third time chart explaining the operation of the first embodiment.

The operational time chart for the circuit of FIG. 14 is basically the same as the time charts of FIGS. 3–5. In contrast to the circuit of FIG. 7 in which a command is sent, the status is received, and the received status is analyzed, thereby creating a time lag, it is possible for the main controller 2 to read from and write to the circuit of FIG. 14 directly. In addition, there is no need to allow for an occurrence of an error during the communication. Hence, the circuit of FIG. 14 has an advantage that the control becomes easy.

A description will now be given, with reference to FIGS. 15 and 16, of a third embodiment of the present invention.

The recording medium dualization system according to the third embodiment is configured such that the medium boards have only the third information, which information is supplied to the communication controllers of the main controller via single lines, and the first and second information are held by the main controller, the first and second information being cleared in synchronization with the reception of the third information by the main controller.

Like the second embodiment of FIG. 6, the main controller 2 of the third embodiment has the communication controllers 2C1 and 2C2. Referring to FIG. 15, since the USE information and the ACT information are provided in the main controller 2, the main controller 2 is connected to the medium boards 0B and 1B via single lines SL1 and SL2, respectively, the signal lines SL1 and SL2 carrying the PWON information of the respective medium boards.

Thus, as a result of the above, only one pin is required, and it is possible to keep the information relating to the active system synchronized with the removal and mounting of the recording medium.

Figure 16:
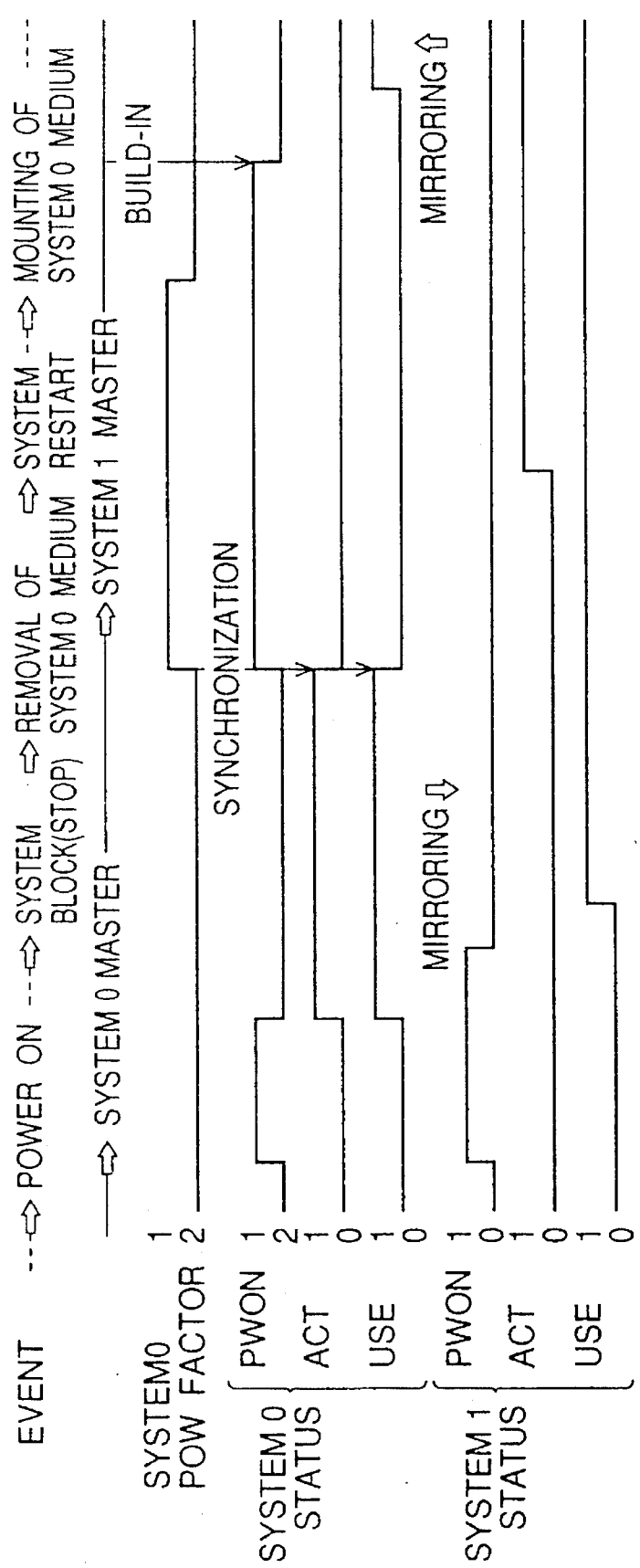
FIG. 16 is a time chart explaining the operation of the third embodiment.

Referring to FIG. 16, it is assumed that a recording medium 0M of the master system is removed during the operation. In sync with this event, which is a PWON factor, the status information of the master system is cleared. Hence, it is possible to start the operation using the slave system immediately upon the restart of the system.

Figure 15:
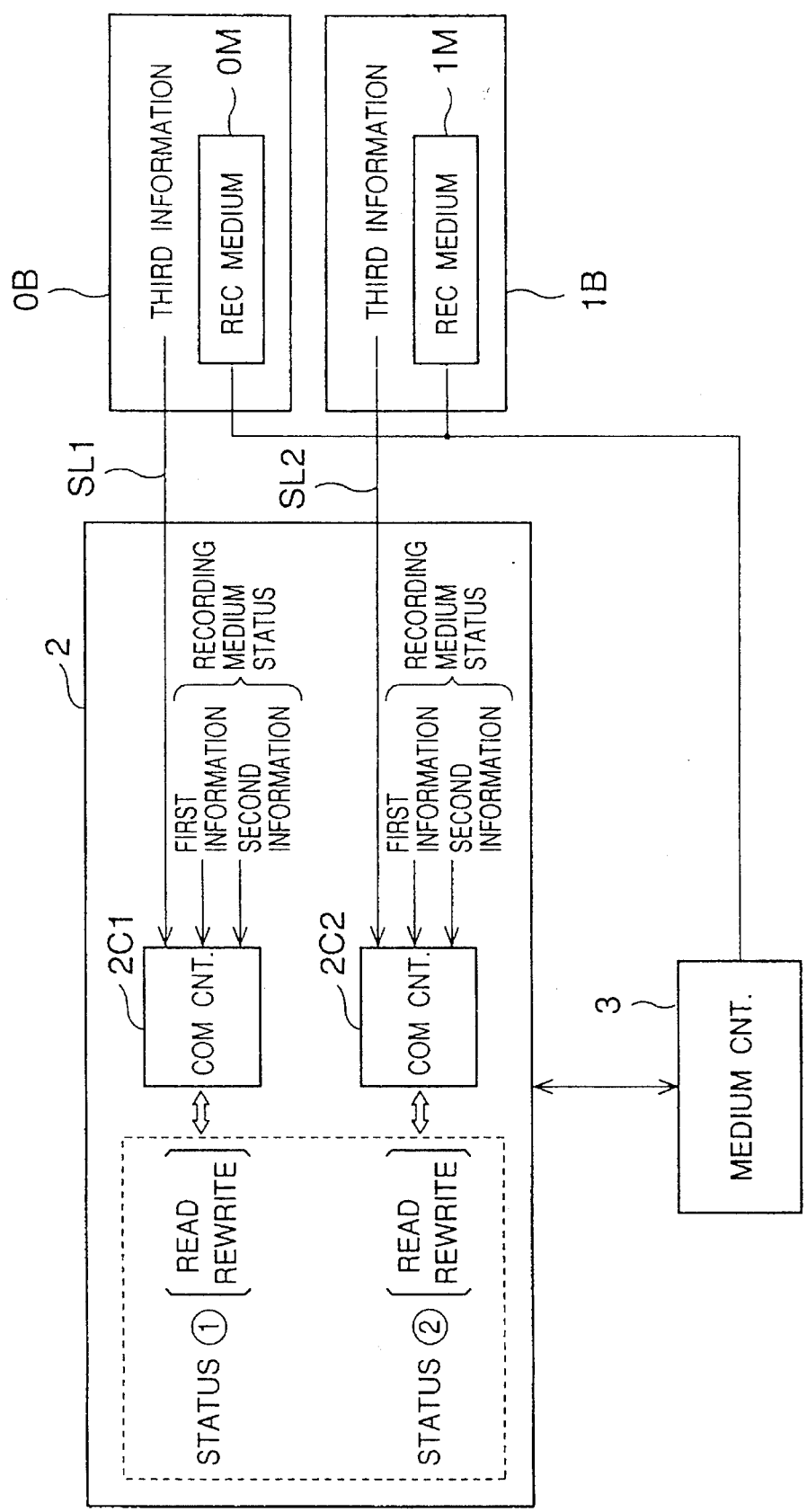
FIG. 15 is a diagram showing the principle of a third embodiment.
Figure 17:
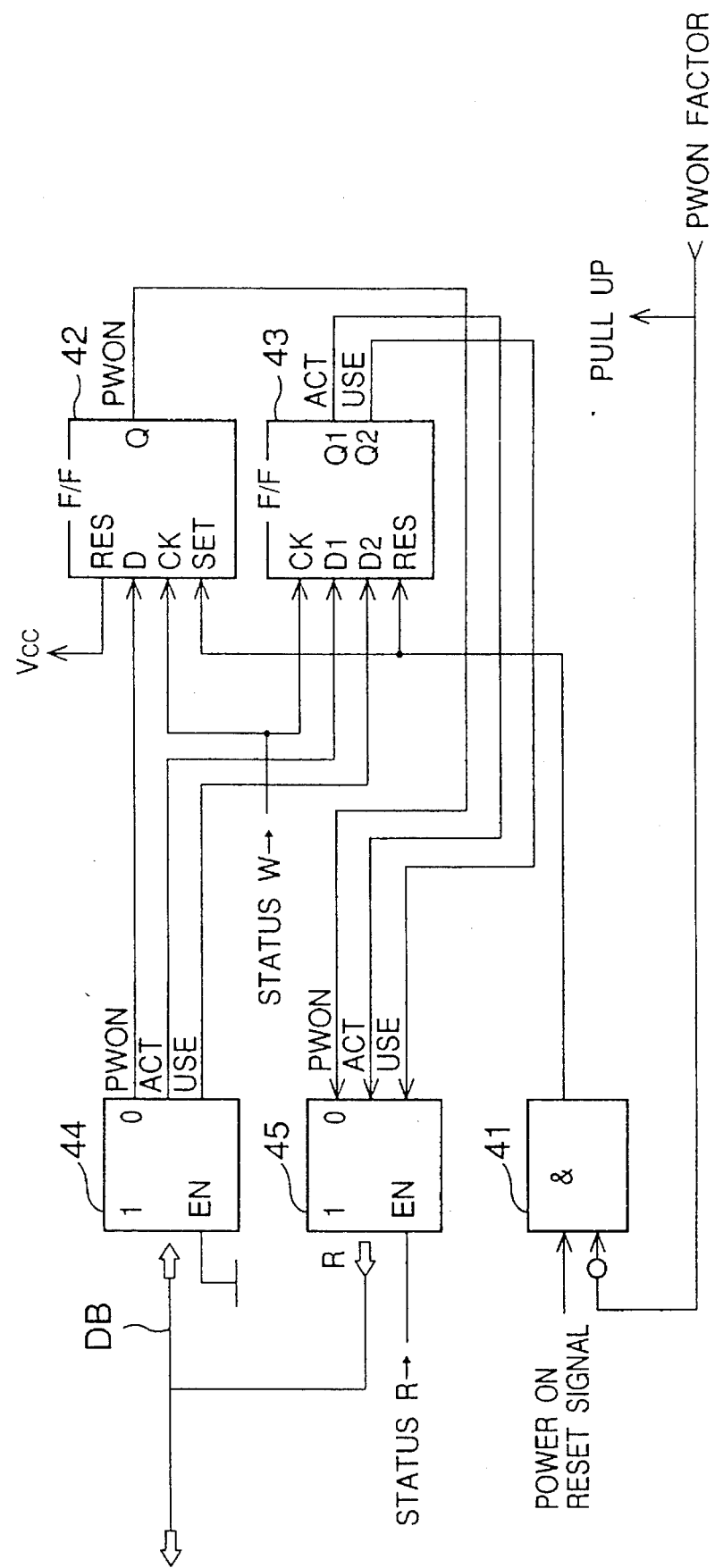
FIG. 17 is a diagram showing the construction of the recording medium dualization system according to the third embodiment.

FIG. 17 shows a construction of the circuit forming the communication controllers 2C1 and 2C2 of the main controller 2 according to the third embodiment shown in FIG. 15. The circuit includes an AND 14 gate which receives a negative form of the third information PWON from the medium board 0B or 1B via a single line SL1 or SL2, and ANDs this reversed signal and the power on reset signal in the main controller 2.

This circuit also includes a flip-flop 42 and a latch circuit 43 which correspond to the flip-flop 13 and the latch circuit 14 of FIG. 7, respectively. The difference is that the flip-flop 42 and the latch circuit 43 are provided in the main controller 2 while the flip-flop 13 and the latch circuit 14 are provided in the communication controllers 0C and 1C. The circuit of FIG. 17 also includes: a gate circuit 44 which sends, to the flip-flop 42, the status bit PWON sent from the inside of the main controller 2 via a data bus DB, and which sends the status bits ACT and USE to the latch circuit 43; and a gate circuit 45 which sends the PWON bit from the flip-flop 42 and the ACT bit and the USE bit from the latch circuit 43 to the inside of the main controller 2 via the data bus DB. The flip-flop 42 and the latch circuit 43 receive a status signal W from the main controller 2 at the clock terminal, and the gate circuit 45 receives a status signal R from the main controller 2 at the enable input.

Figure 18:
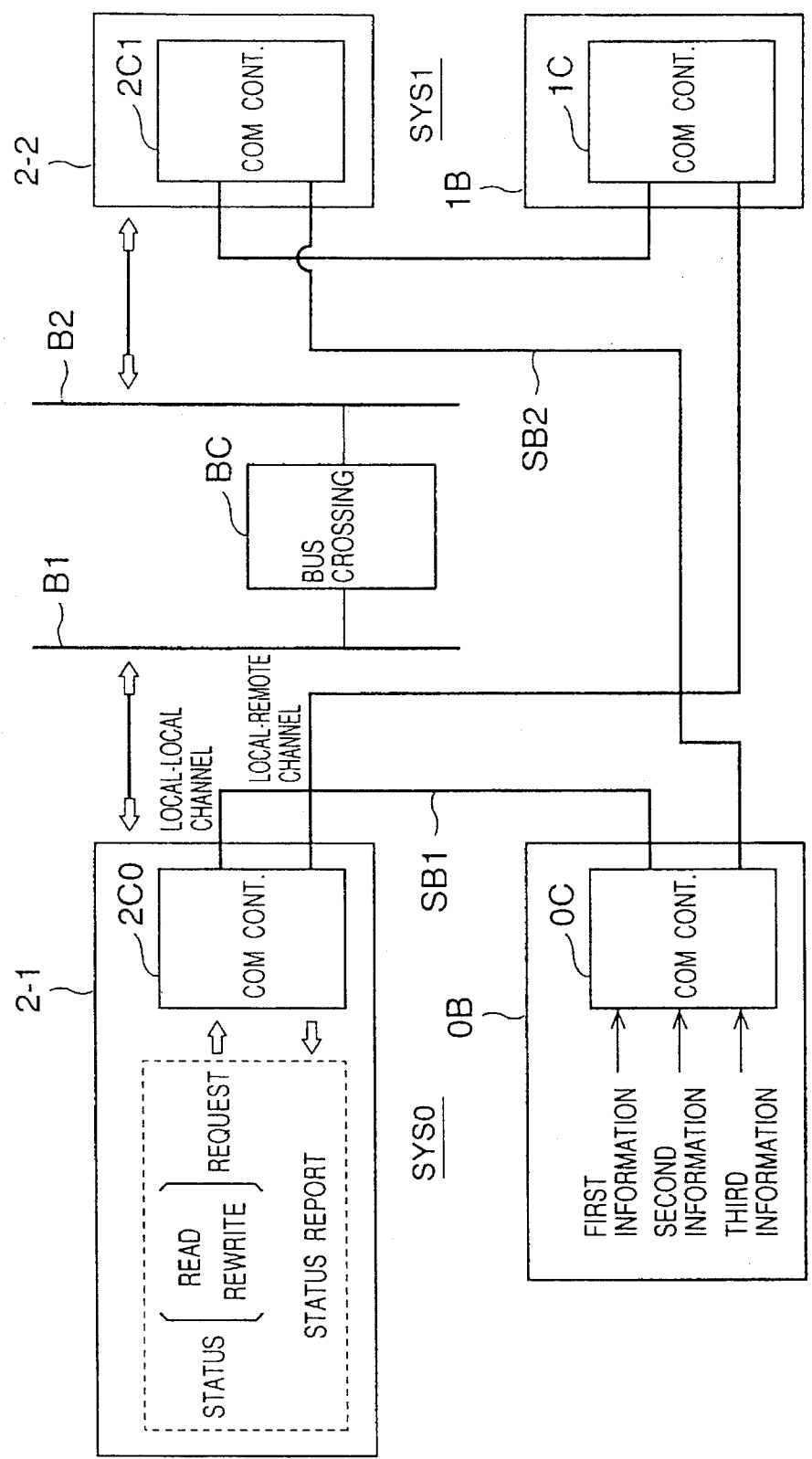
FIG. 18 is a diagram showing the principle of a fourth embodiment.

A description will now be given, with reference to FIGS. 18 and 19, of a fourth embodiment of the present invention.

The recording medium dualization system according to the fourth embodiment is configured such that the medium boards are provided in separate systems, each system including a main controller, the two main controllers in the respective systems being connected to each other via system buses and a bus crossing. When there is a failure or when a switching control from a superior system occurs, the main controller of a non-active system is notified of such an event via the bus crossing and reads and determines the status information of the medium boards in both systems, whereupon the main controller makes a selection of an active system.

Figure 19:
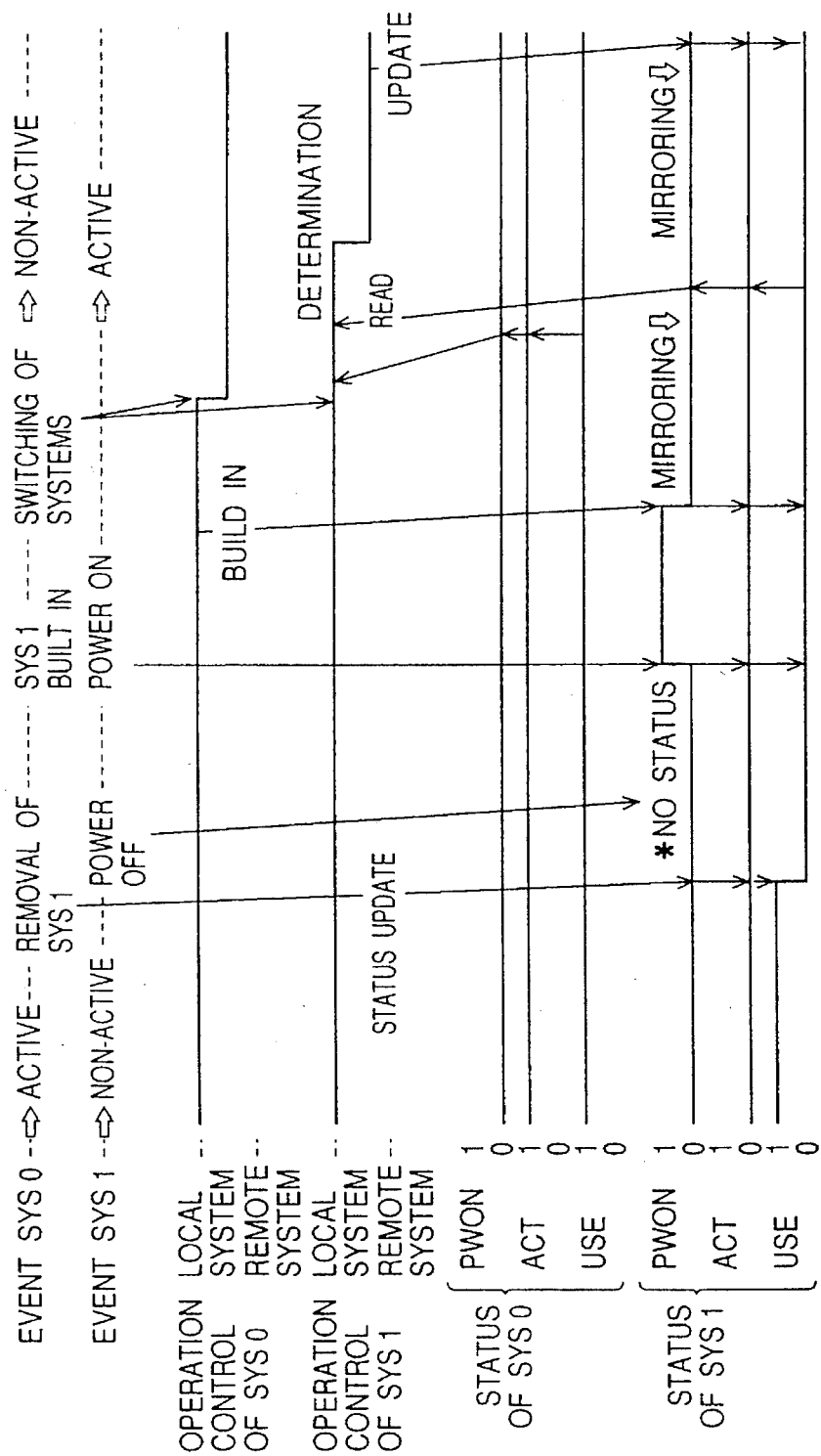
FIG. 19 is a time chart explaining the operation of the fourth embodiment.

Referring to FIG. 19, it is assumed that a system SYS1 is removed while the operation of a system SYS0 is proceeding, and that, when the system SYS1 is built into the operation again, the latest operation information is mirrored onto the recording medium of the system SYS1, which had been removed, so as to ensure that the two sets of information are identical to each other.

However, when a failure occurs in the system SYS0 during the operation or a switching control by a superior system takes place, the system SYS1 is built into the operation before the status of the system SYS1 is updated unless no measure is taken.

Accordingly, the fourth embodiment is configured such that the system SYS1 reads and determines the status of both of the systems when a failure occurs or when a switching control by a superior system takes place, so that the master recording medium 0B in operation can be properly recognized. According to this arrangement, the presence of a recording medium in which a mirroring has not been executed can be detected. Hence, it is ensured that the two sets of information used in the operation are identical to each other, and, as a result, it is possible to restart the system properly.

Since there is only one recording medium that is used in the active system at any given time even when the dualization of the system is executed, both systems access each other via system buses B1 and B2 and a bus crossing BC so as to read and write information relating to the active system. As a result of this, the main controller of the active system can determine which recording medium is to be selected on the basis of the information relating to the active information.

When a switching request occurs while a main controller 2-1 of the active system is using the recording medium 0B, the main controller 2-2 of the non-active system can select, on the basis of the information, the recording medium 0B of the other system in which the information is updated, instead of the recording medium 1B of the system to which the main controller 2-2 belongs to. That is, the starting and operating of the entire system by taking advantage of the bus crossing BC is possible.

Figure 20B:
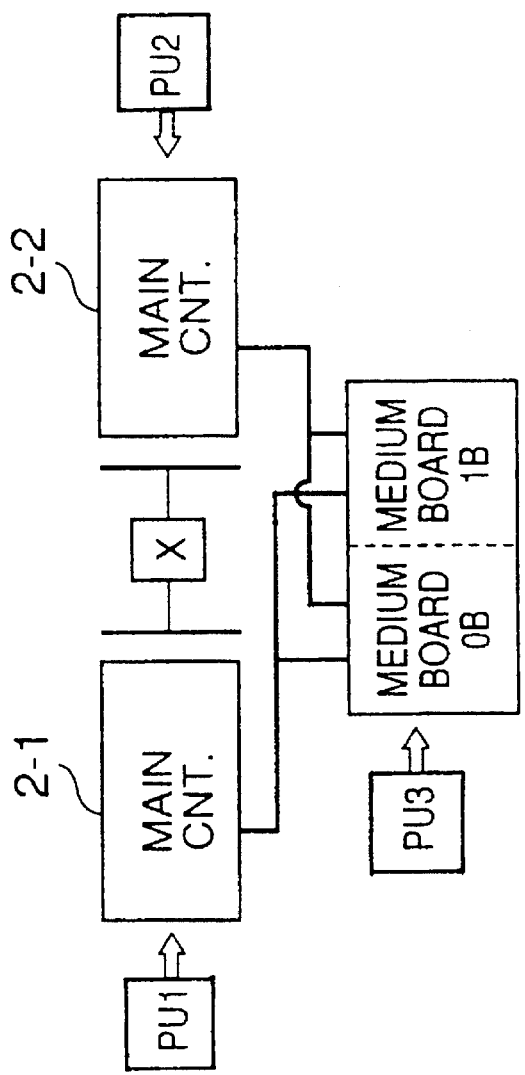
FIG. 20B is a diagram showing a dual power supply system, explaining the principle of a fifth embodiment.
Figure 20A:
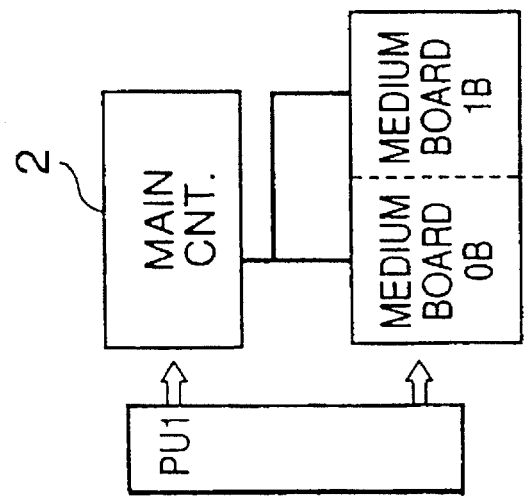
FIG. 20A is a diagram showing a single power supply system.

FIG. 20A shows a single power supply system; and FIG. 20B shows the principle of a fifth embodiment, which is a variation of the fourth embodiment. The main controllers are powered by separate power units, and the medium boards are powered by a common power unit separate from the power units supplying power to the main controllers.

Referring to FIG. 20B, the main controllers 2-1 and 2-2 have respective power units PU1 and PU2, and the medium boards 0B and 1B have a common power unit PU3.

Since the management information status is held in the medium boards, the status of the systems remains held therein unless the power unit PU3 is not turned off. Accordingly, even when the power units PU1 and PU2 of the systems are turned off and then turned on again, it is possible to automatically select the master system and the slave system (which is already built into the operation and in which the mirroring is completed), thus eliminating a likelihood that the operation is started with an erroneous (old) program or operation information and ensuring that the system restart is properly performed.

As has been described above, the main controller of a recording medium dualization system reads, when the power is turned on, three types of information: USE information (status information of a recording medium of each medium board) indicating whether or not the medium can be used; ACT information indicating which of the recording mediums is or was used in an active system; and PWON information indicating whether or not the power for the recording medium is turned on, whereupon the main controller sets the information to denote that the master system is an active system and executes a mirroring process whereby the USE information and the PWON information of the slave system are identical to the master system. When it is found that the recording medium of the master system is removed, on the basis of the USE and ACT information, the slave system is switched to an active system, and the corresponding information setting is performed. When it is found that the recording medium of the master system is mounted, on the basis of the PWON information, the USE information and the PWON information of the slave system are mirrored onto the master system. Therefore, it is possible to detect that an exchange of an external recording medium has taken place when the apparatus or the system is started or while the apparatus or the system is operated. Since the recording medium which has the latest information, and which should be used in a master system, can be determined without an error, the reliability of the entire system is improved.

Even when the information of the active system and that of the reserve system are not identical to each other in a dualized system, the selection of the recording medium which has a content identical to that of the previously active recording medium is achieved, because the system, to which the operation is switched to upon a restart, is able to read the information held in the previously active system. Hence, the present invention has an advantage that an inter-system information update procedure is not necessary.

The present invention is not limited to the above described embodiments, and variations and modifications may be made without departing from the scope of the present invention.

What is claimed is:

1. A recording medium dualization system comprising:

medium boards each including a recording medium and a communication controller, one medium board belonging to a master system and another medium board belonging to a slave system;

at least one main controller including a communication controller connected to said communication controllers of said medium boards;

a medium controller for transferring operation information between the recording mediums and said main controller; and at least one power supplying unit for supplying power to the medium boards, the main controller and the medium controller said main controller instructing, when power supplied from said at least one power supplying unit is turned on, said communication controller thereof to read first information indicating whether or not the recording medium of any of said medium boards can be used, from the communication controllers included in the medium boards, to read second information indicating which one of the recording mediums is or was used in an active system, and to read third information indicating whether or not the power for the recording medium is turned on, whereupon said main controller designates the master system as the active system, sets said first through third information in the active system, and executes a mirroring process such that said first and third information of the slave system is made to be identical to corresponding first and third information in the master system, the slave system being switched to become the active system and said first through third information being set in the active system when it is determined by said main controller, on the basis of the first and second information, that the recording medium of the master system is removed therefrom, and said first through third information of the slave system being mirrored to the master system when it is determined by said main controller, on the basis of said third information, that the recording medium of the master system is mounted therein.

2. The recording medium dualization system as claimed in claim 1, wherein, when said main controller is notified that a failure has occurred in the slave system after said main controller has already been informed, on the basis of said first to third information, that said slave system is used as an active system, said main controller sets the first and second information of said slave system to denote that said slave system is a non-active system, whereupon said main controller obtains said first through third information relating to the master system and switches said master system to an active system.

3. The recording medium dualization system as claimed in claim 1, wherein, when said main controller is notified that a failure has occurred in the slave system after said main controller has already been informed, on the basis of said first through third information, that said slave system is used as an active system, said main controller sets the first and second information of said slave system to denote that said slave system is a non-active system, whereupon said main controller obtains said first through third information relating to the master system and stops the master system if it is determined that the recording medium of said master system is disabled.

4. The recording medium dualization system as claimed in claim 1, wherein the communication controller of said main controller is connected to the communication controllers of the respective medium boards via a serial bus.

5. The recording medium dualization system as claimed in claims 1, wherein said main controller has two communication controllers which are connected to the respective communication controllers of the medium boards via respective parallel buses.

6. The recording medium dualization system as claimed in claim 5, wherein the medium boards have only the third information, which information is supplied to the communication controllers of said main controller via single lines, and the first and second information are held by said main controller, the first and second information being cleared in synchronization with the reception of said third information by said main controller.

7. The recording medium dualization system as claimed in claim 1, wherein the medium boards are provided in separate systems, each system including a main controller, the two main controllers in said separate systems being connected to each other via a first system bus, a second system bus and a bus crossing connected therebetween, the main controller of a non-active system of said separate systems detecting, via the bus crossing, an occurrence of a failure in the active system or a switching control by a host system for said main controller of the non-active system, and reading and determining status information of the medium boards in both of said separate systems, and making a selection of an active system from said separate systems.

8. The recording medium dualization system as claimed in claim 7, wherein the main controllers are powered by separate power units, and the medium boards are powered by a common power unit separate from said power units supplying power to the main controllers.

9. The recording medium dualization system as claimed in claim 1, wherein said at least one power supplying unit is a single power supplying unit common to said medium boards, said main controller and said medium controller.

* * * * *